United States Patent [19]

Furukawa

[11] Patent Number: 4,808,957
[45] Date of Patent: Feb. 28, 1989

[54] MAGNETIC SHIELD APPARATUS
[75] Inventor: Hiroshi Furukawa, Kawachi, Japan
[73] Assignee: Kabushiki Kaisha Toshiba, Kawasaki, Japan
[21] Appl. No.: 203,855
[22] Filed: Jun. 8, 1988
[30] Foreign Application Priority Data
Jun. 10, 1987 [JP] Japan .................. 62-143231
[51] Int. Cl.[4] .............................. H01F 7/00
[52] U.S. Cl. ................... 335/301; 335/304; 324/318
[58] Field of Search ............... 335/299, 301, 304; 324/318, 319, 320, 321
[56] References Cited
U.S. PATENT DOCUMENTS

| | | | |
|---|---|---|---|
| 3,437,963 | 4/1969 | Gang et al. | 335/301 X |
| 3,460,083 | 8/1969 | Johnson | 335/301 X |
| 4,490,675 | 12/1984 | Knuetter et al. | 335/301 X |
| 4,646,045 | 2/1987 | Chari et al. | 335/301 |
| 4,758,812 | 7/1988 | Forster et al. | 335/301 |

Primary Examiner—George Harris
Attorney, Agent, or Firm—Foley & Lardner, Schwartz, Jeffery, Schwaab, Mack, Blumenthal & Evans

[57] ABSTRACT

A magnetic shield apparatus for shielding against magnetic leakage escaping from a cylindrical magnet unit having a columnar cavity, for generating a static magnetic field along the axial direction of the cavity, has a plurality of magnetic shield members which shield against magnetic leakage escaping from the magnet unit. The magnetic shield members are sequentially joined, with the joint portions of the magnetic shield members extending along the axial direction of the cavity, so as to surround the magnet unit. Casters are attached to each magnetic shield member. The magnetic shield members are fixed by bolts or the like so as to surround the magnet unit.

7 Claims, 5 Drawing Sheets

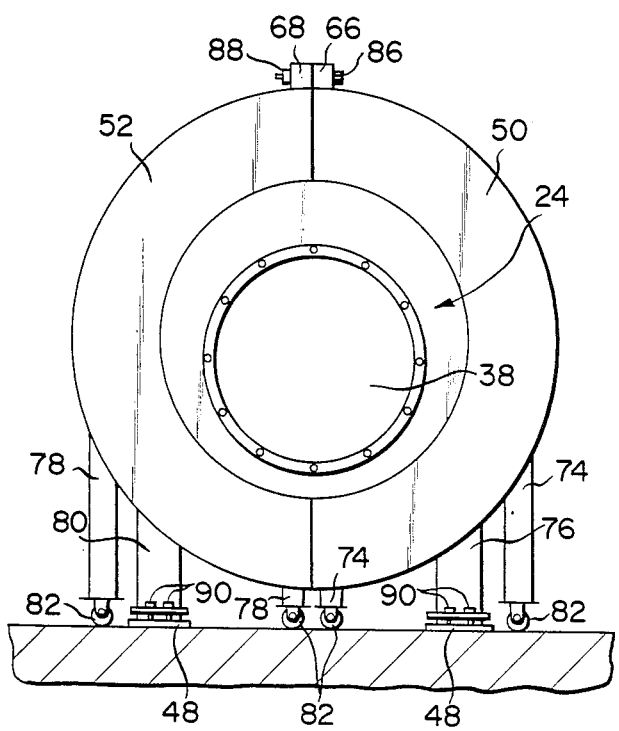
F I G. 6

MAGNETIC SHIELD APPARATUS

BACKGROUND OF THE INVENTION

1. Field of the Invention

The present invention relates to a magnetic shield apparatus applied to a magnetic resonance imaging system, or the like using a magnetic field to obtain medical information of a patient.

2. Description of the Related Art

A static field generating device for generating a static magnetic field is used in a conventional magnetic resonance imaging apparatus. In general, the static field generating device must generate a high, uniform magnetic field in order to realize a high quality image. A superconducting magnet unit using a superconductor has been recently used as a static field generating device capable of generating a high magnetic field.

A conventional static field generating device using a superconductor comprises magnet unit 2, as shown in FIG. 1. Magnet unit 2 includes double cylindrical casing 4. Casing 4 includes inner and outer cylinders 6 and 8. Both ends of the space between inner and outer cylinders 6 and 8 are closed by end plates 10, respectively. Both ends of inner cylinder 6 are open. Columnar cavity 14 is defined by the inner circumferential surface of inner cylinder 6 of casing 4. Superconducting coil 16 is arranged with coolant 18 such as liquid helium in casing 4, i.e., between inner and outer cylinders 6 and 8. A current is supplied to superconducting coil 16 through power supply leads (not shown). Therefore, magnet unit 2 is excited in a permanent current mode.

With this arrangement, a high, uniform static magnetic field can be generated along the axial direction of columnar cavity 14.

However, magnetic leakage cannot be neglected. More specifically, as a magnetic field in cavity 14 is increased, the magnitude and area of magnetic leakage are increased. For this reason, the magnetic leakage adversely affects information processing units and other medical equipments which are mounted around the static field generating unit. For example, the magnetic leakage causes distortion of an image from an image pickup tube of an X-ray TV system and an image from an image intensifier, or color misregistration in a color TV monitor. For this reason, installation conditions of the magnetic resonance imaging apparatus are undesirably complicated due to the influence of magnetic leakage.

In order to solve the above problems, the outer surface of the magnet unit has been covered with a magnet shield comprising a magnetic body such as iron. More specifically, a magnetic shield having substantially the same shape as a casing is integrally mounted on the outer surface of the casing. Then, the influence of magnetic leakage can be reduced.

However, since the weight of the magnet unit is about 3.0 tons or more, it is difficult to transport the magnet unit to a facility such as a hospital. When the magnetic shield having substantially the same weight as the magnet unit is additionally mounted on the magnet unit, the weight and size of the entire static field generating device are increased. Therefore, it is more difficult to transport the magnet unit to a facility.

SUMMARY OF THE INVENTION

It is an object of the present invention to provide a magnetic shield apparatus which can reduce magnetic leakage and can be easily transported to a facility.

According to aspect of the present invention, there is provided a magnetic shield apparatus for shielding magnetic leakage from cylindrical magnetic field generating means, having a columnar cavity, for generating a static magnetic field along an axial direction of said cavity, comprising:

a plurality of magnetic shielding means for shielding magnetic leakage from said magnetic field generating means, said plurality of magnetic shielding means being sequentially joined so as to surround said magnetic field generating means and joint portions thereof extending along the axial direction of said cavity;

a plurality of movable means supporting said magnetic shielding means; and fixing means for fixing said magnetic shielding means in a state wherein said magnetic shielding means surround said magnetic field generating means.

BRIEF DESCRIPTION OF THE DRAWINGS

FIG. 6 is a front view showing a state wherein the magnetic shield members of the magnetic field generating unit in FIG. 1 are mounted on a magnet unit.

DETAILED DESCRIPTION OF THE PREFERRED EMBODIMENT

A preferred embodiment of the present invention will now be described below with reference to FIGS. 2 to 6.

Figure 1:
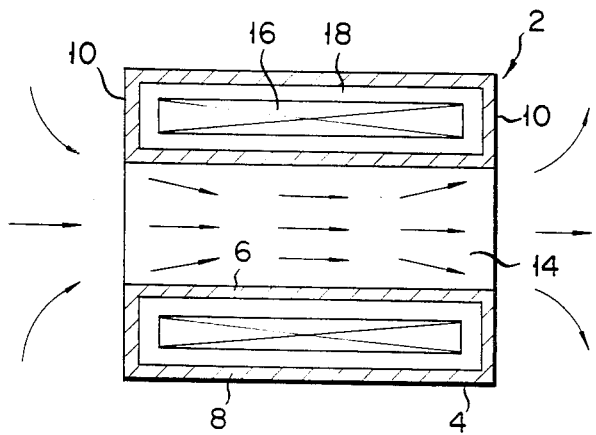
FIG. 1 is a sectional view showing a conventional magnet unit.
Figure 2:
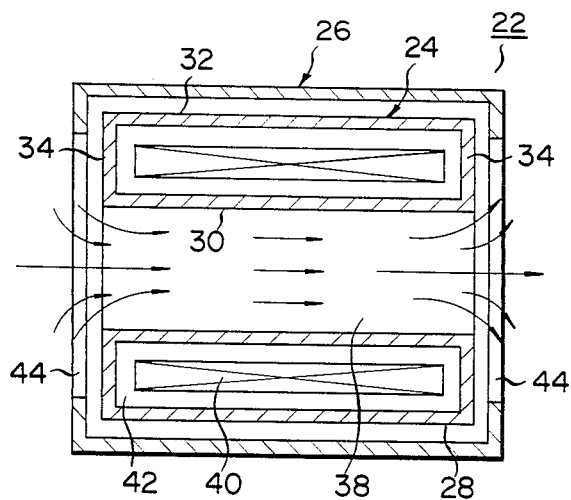
FIG. 2 is a sectional view showing a magnetic field generating unit using a magnetic shield apparatus according to an embodiment of the present invention.

In FIG. 2, reference numeral 22 denotes a static field generating device. Static field generating device 22 comprises magnet unit 24 for generating a static magnetic field and magnetic shield apparatus 26 for reducing the amount of magnetic leakage therein.

Magnet unit 24 includes double cylindrical casing 28. Casing 28 includes inner and outer cylinders 30 and 32. Both ends of the space between inner and outer cylinders 3 and 32 are closed by end plates 34, respectively. Both ends of inner cylinder 30 are open. Columnar cavity 38 is defined by the inner circumferential surface of inner cylinder 30 of casing 28. Superconducting coil 40 is arranged with coolant 42 such as liquid helium in casing 28, i.e., between inner and outer cylinders 30 and 32. A current is supplied to superconducting coil 40 through power supply leads (not shown). Thus, because magnet unit 24 is excited in a permanent current mode, it can therefore generate a high, uniform static magnetic field along the axial direction of columnar cavity 38.

Magnetic shield apparatus 26 has a substantially cylindrical shape and is arranged, in a predetermined gap, around magnet unit 24. Circular openings 44 opposing cavity 38 are formed on both end surfaces of magnetic shield apparatus 26.

Figure 3:
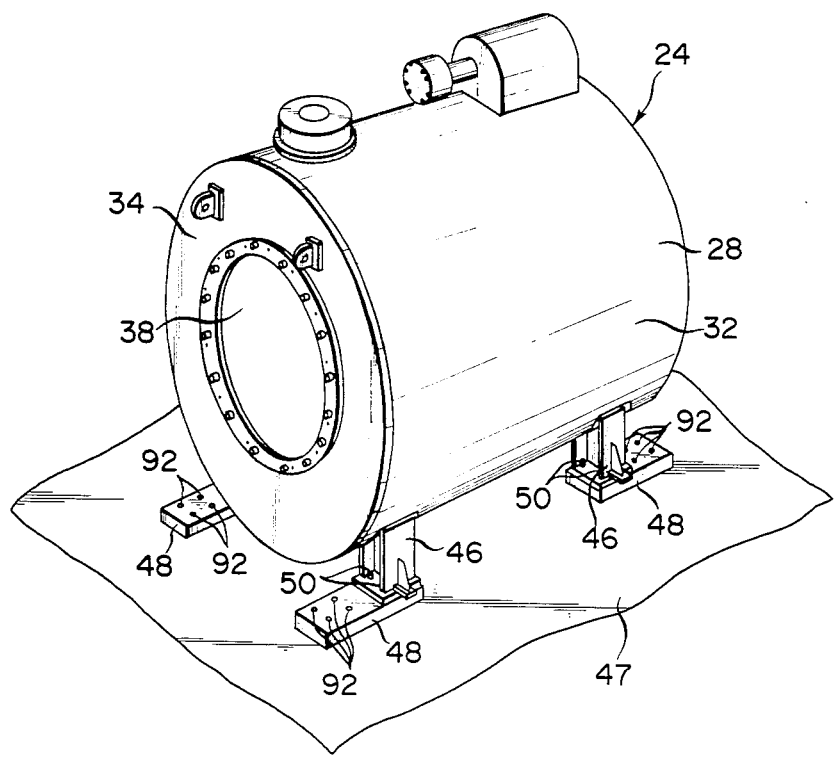
FIG. 3 is a perspective view showing a magnet unit used in the magnetic field generating unit shown in FIG. 1.

As shown in FIG. 3, four legs 46 are mounted on the bottom portions of magnet unit 24. Legs 46 are fixed by bolts 50 on four fixing bases 48 which are, in turn, fixed on installation floor 47.

Figure 4:
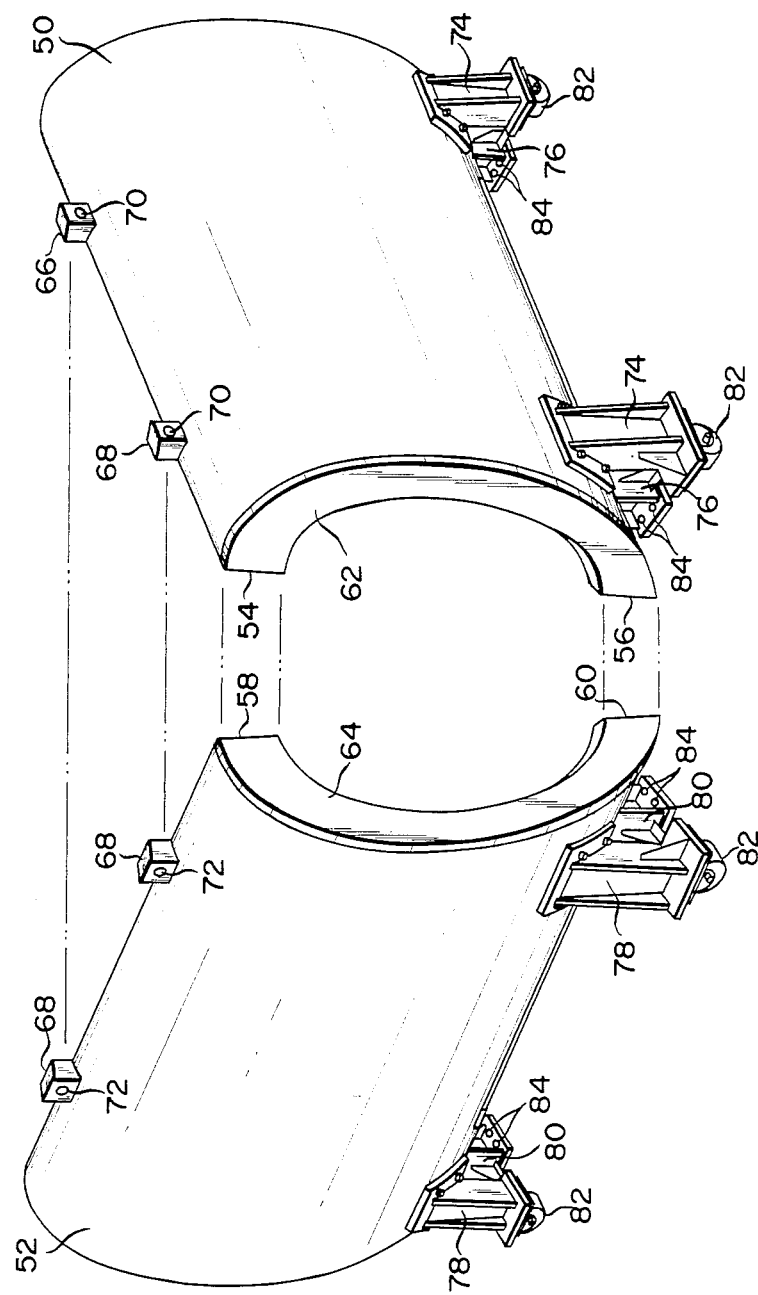
FIG. 4 is a perspective view showing a magnetic shield apparatus used in the magnetic field generating unit shown in FIG. 1.

As shown in FIG. 4, magnetic shield apparatus 26 comprises a pair of magnetic shield members 50 and 52. Magnetic shield members 50 and 52 each having a semicircular cross section are defined by dividing a cylinder along a vertical direction. One magnetic shield member 50 includes upper and lower edges 54 and 56 along the axial direction. The other magnetic shield member 52 includes upper and lower edges 58 and 60 along the axial direction. Upper edges 54 and 58 are joined together. Lower edges 56 and 60 are similarly joined together. Semicircular flanges 62 and 64, each extending inward in a direction perpendicular to the axial direction of the magnetic shield apparatus, are respectively attached to the end portions of magnetic shield members 50 and 52. Opening 44 described above is defined at each end of the magnetic shield apparatus, between flanges 62 and 64.

A pair of fixing pieces 66 are attached near upper edges 54 of magnetic shield member 50. A pair of fixing pieces 68 corresponding to fixing pieces 66 are attached near upper edges 58 of magnetic shield member 52. Insertion holes 70 and 72 are formed in fixing pieces 66 and 68, respectively.

Two pairs of moving legs 74 and a pair of fixing legs 76 are attached near lower edges 56 of magnetic shield member 50. Two pairs of moving legs 78 and a pair of fixing legs 80 are mounted near lower edges 60 of magnetic shield member 52. Casters 82 are respectively attached to moving legs 74 and 78. Insertion holes 84 are formed in fixing legs 76 and 80.

Figure 5:
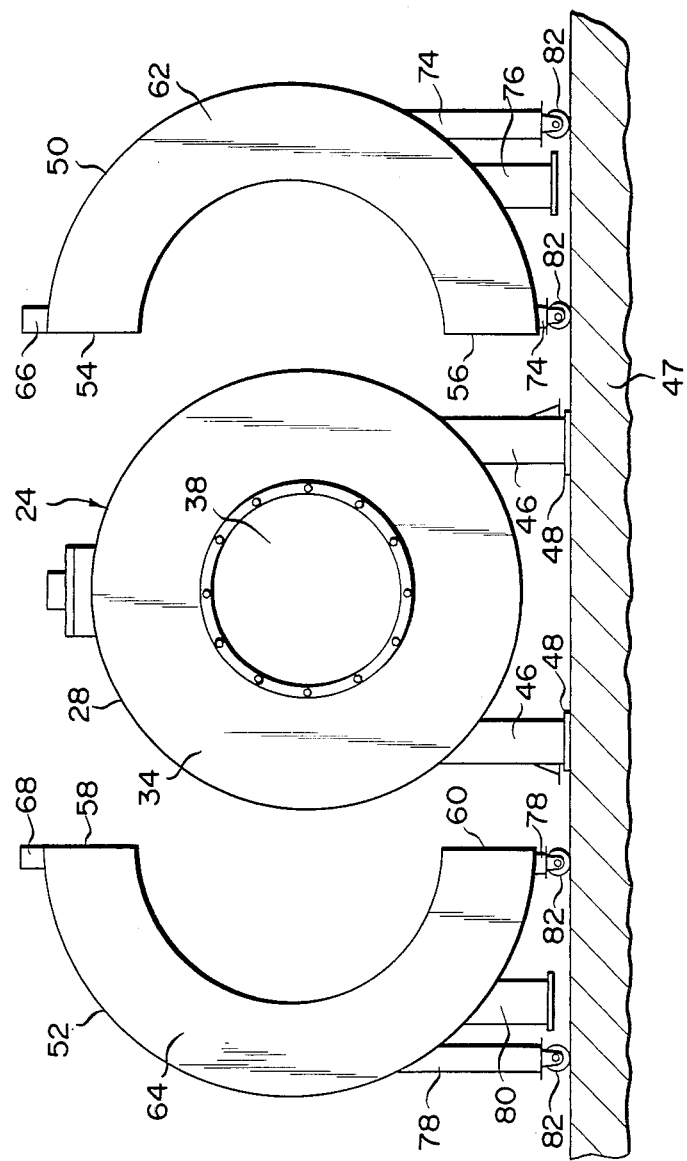
FIG. 5 is a front view showing a state wherein magnetic shield members of the magnetic field generating unit in FIG. 1 are spaced apart from a magnet unit.

When static field generating device 22 is installed on the floor in a facility such as a hospital, magnet unit 24 must first be transported and fixed at a desired location. Then, magnetic shield members 50 and 52 must be transported separately from the magnet unit 24 and positioned on both sides of magnet unit 24, as shown in FIG. 5. Subsequently, as shown in FIG. 6, magnetic shield members 50 and 52 are moved toward magnet unit 24. Then upper edges 54 and 58 of magnetic shield members 50 and 52 are joined together. Similarly, lower edges 56 and 60 of magnetic shield members 50 and 52 are joined together. Bolts 86 are inserted in insertion holes 70 and 72 of fixing pieces 66 and 68, and fastened using nuts 88, respectively. In addition, bolts 90 are inserted in insertion holes 84 of fixing legs 76 and are threadably engaged with internal threads 92 (as shown in FIG. 3) formed on fixing bases 48.

With this arrangement, a desired static magnetic field which has a high intensity and uniformity can be generated in cavity 38, as shown in FIG. 2. In addition, magnetic leakage is shielded by magnetic shield members 50 and 52. Therefore, the area of magnetic leakage is largely restricted.

Since magnetic shield members 50 and 52 are joined with each other to cover magnet unit 24, compact and lightweight magnetic shield members 50 and 52 are realized. Furthermore, magnetic shield members 50 and 52 can be separately transported in a photographing room. Therefore, magnetic shield members 50 and 52 can be easily transported into the photographing room.

Casters 82 are respectively attached to magnetic shield members 50 and 52, so that they can be easily transported into the photographing room without a transporting device.

Magnetic shield members 50 and 52 each having semicircular cross section are defined by dividing a cylinder along a vertical direction. Therefore, magnetic shield members 50 and 52 can be set near magnet unit 24 along a direction perpendicular to the axial direction of magnet unit 24. For this reason, magnetic shield members 50 and 52 can be easily installed in a small space, such as a space having a low ceiling.

In addition, the pair of magnetic shield members 50 and 52 are joined to each other along the axial direction of magnet unit 24. Therefore, no joint portions are present along a direction of magnetic flux passing through magnetic shield members 50 and 52. In other words, magnetic fluxes passing through magnetic shield members 50 and 52 are not shielded. Therefore, a magnetic reluctance is not increased and a function for shielding magnetic leakage is not impaired.

What is claimed is:

1. A magnetic shield apparatus for shielding against magnetic leakage escaping from cylindrical magnetic field generating means having a columnar cavity, for generating a static magnetic field along an axial direction of said cavity, said magnetic shield apparatus comprising:

a plurality of magnetic shielding means for shielding against magnetic leakage escaping from said magnetic field generating means, said plurality of magnetic shielding means being sequentially joined, with the joint portions thereof extending along the axial direction of said cavity, so as to surround said magnetic field generating means;

a plurality of movable means supporting said plurality of magnetic shielding means, respectively; and fixing means for fixing said magnetic shielding means in such a way that said magnetic shielding means surround said magnetic field generating means.

2. The apparatus according to claim 1, wherein said magnetic shielding means comprise two pairs of edges which extend along the axial direction of said cavity, the adjacent edges of said two pairs of edges being joined.

3. The apparatus according to claim 1, wherein said magnetic shielding means comprise magnetic shield members each having a semicircular cross section.

4. The apparatus according to claim 1, wherein said magnetic shielding means comprise magnetic shield members each having a semicircular cross section obtained by cutting a cylinder in a vertical direction.

5. The apparatus according to claim 1, wherein said movable members comprise legs coupled to said magnetic shielding means and casters attached to said legs.

6. The apparatus according to claim 1, wherein said fixing means comprise first fixing means for fixing said magnetic shielding means to one another and second fixing means for fixing said magnetic shielding means to a surface of an installation floor.

7. A magnet unit comprising:

cylindrical magnetic field generating means, having a columnar cavity, for generating a static magnetic field along an axial direction of said cavity;

a plurality of magnetic shielding means for shielding against magnetic leakage escaping from said magnetic field generating means, said plurality of magnetic shielding means being sequentially joined, with joint portions thereof extending along the axial direction of said cavity, so as to surround said magnetic field generating means;

a plurality of movable means supporting said plurality of magnetic shielding means, respectively; and fixing means for fixing said magnetic shielding means in such a way that said magnetic shielding means surround said magnetic field generating means.

* * * * *